United States Patent [19]
Runaldue

[11] Patent Number: 5,812,619
[45] Date of Patent: Sep. 22, 1998

[54] DIGITAL PHASE LOCK LOOP AND SYSTEM FOR DIGITAL CLOCK RECOVERY

[75] Inventor: Thomas Jefferson Runaldue, San Jose, Calif.

[73] Assignee: Advanced Micro Devices, Inc., Sunnyvale, Calif.

[21] Appl. No.: 608,165

[22] Filed: Feb. 28, 1996

[51] Int. Cl.$^6$ .................................. H03D 3/24; H04L 7/02
[52] U.S. Cl. .................. 375/376; 375/360; 375/361; 327/159
[58] Field of Search ...................... 375/376, 373, 375/371, 360, 333, 282, 355, 374, 359, 361; 331/1 A, 25; 327/159, 156, 160

[56] References Cited

U.S. PATENT DOCUMENTS

| | | | |
|---|---|---|---|
| 4,231,071 | 10/1980 | Anderson | 360/40 |
| 4,546,486 | 10/1985 | Evans | 375/376 |
| 4,608,702 | 8/1986 | Hirzel et al. | 375/360 |
| 5,168,511 | 12/1992 | Boles | 375/328 |
| 5,276,716 | 1/1994 | Wincn | 375/376 |
| 5,436,937 | 7/1995 | Brown et al. | 375/376 |
| 5,504,751 | 4/1996 | Ledzius et al. | 375/360 |

FOREIGN PATENT DOCUMENTS

| | | |
|---|---|---|
| 0282202 | 9/1988 | European Pat. Off. . |
| 0425302 | 10/1990 | European Pat. Off. . |

*Primary Examiner*—Stephen Chin
*Assistant Examiner*—Betsy L. Deppe
*Attorney, Agent, or Firm*—Sawyer & Associates

[57] ABSTRACT

A digital phase lock loop and system for data extraction and clock recovery of Ethernet data reduces power consumption, area, and noise sensitivity. In one aspect, a digital phase lock loop (PLL) includes a data extraction and end of transmission delimiter (ETD) circuit, an edge detection comparator coupled to the data extraction and ETD circuit, an up/down counter coupled to the edge detection comparator, and a phase adjustment oscillator coupled to the counter and to the data extraction and ETD circuit for producing phase adjustments in a reference clock signal in accordance with shifts in the frequency of the data. In a system aspect of the present invention, the system receives the data in a digital PLL circuit, and adjusts a phase of a reference clock and a sample clock to track transitions in the data through the digital PLL.

25 Claims, 3 Drawing Sheets

DIGITAL PLL BLOCK DIAGRAM

DIGITAL PHASE LOCK LOOP AND SYSTEM FOR DIGITAL CLOCK RECOVERY

FIELD OF THE INVENTION

The present invention relates to clock recovery and data extraction in Ethernet data transmission, and more particularly to clock recovery and data extraction using digital circuitry.

BACKGROUND OF THE INVENTION

Typical current Ethernet products utilize an analog Phase Lock Loop (PLL) for recovering the clock of incoming data on a network. As is well-known to those skilled in the art, incoming data is typically in Manchester format which normally has a transition at a bit cell center, a bit cell being a symbol of information that represents a bit. FIG. 1 illustrates an example of an Ethernet data packet utilizing Manchester data format The packet includes a preamble portion, a data portion and an end of transmission delimiter (ETD) portion. The preamble portion is usually indicated by an alternating series of high and low transitions, and the ETD is usually indicated by a high level for a specified minimum time duration.

The receive circuitry typically attempts to track the transitions of the bit cell center to determine whether the bit transmitted is a '1' or '0'. A local on-chip clock oscillator operates close to produce a reference clock signal that attempts to track the frequency of the transitions of the bit cell center. Unfortunately, the oscillator frequency is not exactly the same as the data frequency. The PLL thus attempts to track the frequency shift between the oscillator and the incoming data over time to maintain data sampling at the proper frequency.

FIG. 2 illustrates a block diagram of the elements conventionally employed to form an analog PLL. A phase comparator 10 receives incoming data typically in Manchester format. The phase comparator 10 determines whether the received data lags or leads a Reference_Clock. When the data lags the Reference_Clock, the comparator 10 issues a down adjust signal (DWN_TICK) to a charge pump 12. Conversely, when the data leads the Reference_Clock, the phase comparator 10 issues an up adjust signal (UP_TICK) to the charge pump 12. The charge pump 12 then removes or adds charge to the circuit acting like an integrator by issuing an appropriate Analog_Voltage signal to a voltage to frequency oscillator (VCO) circuit 14.

The VCO circuit 14 receives the Analog_Voltage signal and adjusts its frequency of operation accordingly. Typically, the VCO 14 is a variable multivibrator circuit fed back through a divide by four circuit 16. The VCO 14 traditionally operates and outputs a 40 MHz (megahertz) VCO Clock signal so that the divide by four circuit 16 produces several phases of the 40 MHz VCO clock. These several phases act as a phase comparator for the bit cell center of the incoming data. The Reference_Clock signal is suitably adjusted by the VCO 14 and represents a signal with a falling edge generated in correspondence with the bit cell center of the data.

Since data tends to jitter in real system operation, edges of data can bounce around within a limit of about 18 ns (nanoseconds) and still be within the IEEE specifications for Manchester data. The feedback loop of the PLL is intended to make the adjustment to the VCO 14 to track the average mean of the jittering. Thus, a Sample_Clock signal is suitably generated by the divide by four circuit 16 and represents a signal ¼ phase delayed from the Reference_Clock. As the Reference_Clock shifts, the Sample_Clock follows. The Sample_Clock becomes the Receive Clock signal by ANDing the Sample_Clock with the receive carrier sense signal (RCV_CRS) and is typically input to the data extraction and ETD circuit 18 to allow sampling of data at the quarter cell point. Sampling at the quarter cell point, and correspondingly at the three quarter cell point of the bit cell of data, suitably indicates the transition at the bit cell center. Thus, the Sample_Clock is adjusted with the Reference_Clock to maintain proper data sampling of jittering data.

The data extraction and ETD circuit 18 decodes the incoming data and outputs a Carrier Sense signal to indicate the initial reception of data which results in the circuit being resynced by a RESYNC signal. The data extraction and ETD circuit 18 also outputs a Receive Data signal when it decodes a non-return to zero (NRZ) or non-Manchester data to indicate reception of invalid Manchester data and signal the end of transmission.

The PLL of FIG. 2 further includes a loop filter 20 that is typically a low pass filter and acts as a dampening circuit. The loop filter 20 preferably is designed and utilized to keep the closed loop feedback system of the PLL from oscillating itself, as is well understood by those skilled in the art.

Although analog PLLs have been used to perform clock recovery functions for Ethernet data, several problems arise due to the nature of the analog components. The use of analog components results in significant sensitivity to noise, requires a large area, and consumes moderate amounts of power. Some attempts to reduce the noise sensitivity involve adding decoupling capacitors, which adds further components to the circuit, thus increasing the circuit's size.

A need exists for a circuit that performs data extraction and clock recovery of Ethernet data, while consuming less power and area, and increasing noise immunity. The present invention addresses such a need.

SUMMARY OF THE INVENTION

The present invention provides a digital phase lock loop and system for data extraction and clock recovery of Ethernet data the reduces power consumption, area, and noise sensitivity. In one aspect, a digital phase lock loop (PLL) includes a data extraction and end of transmission delimiter (ETD) circuit, an edge detection comparator coupled to the data extraction and ETD circuit, an up/down counter coupled to the edge detection comparator, and a phase adjustment oscillator coupled to the counter and to the data extraction and ETD circuit for producing phase adjustments in a reference clock signal in accordance with shifts in the frequency of the data.

In a further aspect, the data extraction and ETD circuit further includes a preamble acquisition circuit for detecting the acquisition of a preamble portion of the Ethernet data. The preamble acquisition circuit further includes a linear shift back counter, state selection logic coupled to the linear shift back counter, and output logic coupled to the state selection logic.

The phase adjustment oscillator adjusts a reference clock signal and a sample clock signal by a phase adjustment within Ethernet specifications, including a 5 ns phase adjustment.

In a system aspect of the present invention, the system receives the data in a digital PLL circuit, and adjusts a phase of a reference clock and a sample clock to track transitions in the data through the digital PLL. The system receives the data in a data extraction and ETD circuit and an edge detection comparator of the digital PLL and determines an end of acquisition of a preamble portion of the data with a preamble acquisition circuit of the data extraction and ETD circuit. In a further aspect, the system determines whether the reference clock and data are synchronous in the edge detection comparator, outputs an up/down adjust signal from the edge detection circuit when the data and reference clock are not synchronous, and adjusts an up/down counter from the up/down adjust signal.

Additionally, the system outputs an up tick and a down tick signal from the up/down counter when a predetermined count value in a predetermined count direction has been reached. The outputting of the up tick preferably occurs when the predetermined count value is eight and the predetermined count direction is positive. Conversely, the outputting of the down tick occurs when the predetermined count value is minus eight and the predetermined count direction is negative.

The system further receives the up tick and down tick signals in a phase adjustment oscillator, wherein the phase adjustment oscillator alters the phase of the reference clock and sample clock by a predetermined phase period.

With the present invention, a digital PLL accurately performs clock recovery functions for Ethernet data in Manchester format transmitted in a communications network. Additionally, the present inventions achieves sufficient resolutions in phase adjustments through digital components to track shifts in the frequency of the data over time. With the digital components of the present invention, digital clock recovery successfully occurs, while power consumption, circuit size, and noise sensitivity are less than that of an analog PLL. These and other advantages of the aspects of the present invention will be more fully understood in conjunction with the following detailed description and accompanying drawings.

DETAILED DESCRIPTION

The present invention relates to improving the noise immunity and reducing the power and area consumption of clock recovery circuitry through a digital PLL circuit. The following description is presented to enable one of ordinary skill in the art to make and use the invention and is provided in the context of a patent application and its requirements. Various modifications to the preferred embodiment and the generic principles and features described herein will be readily apparent to those skilled in the art.

In operation, the present invention provides a digital phase lock loop (PLL) that performs digital clock recovery on received Manchester data. The digital PLL utilizes a counter-based design scheme that produces finely tuned phase adjustments to compensate for small slippings of frequency in Ethernet data. Similar to the analog PLL of FIG. 2, the digital PLL of the present invention utilizes a Sample clock signal that is ¼ phase delayed from a Reference clock signal for sampling incoming data at the quarter cell (and three quarter cell) point. The details of the elements of the digital PLL and utilization of the Reference clock and Sample clock signals are presented with reference to FIGS. 3–5.

Figure 2:
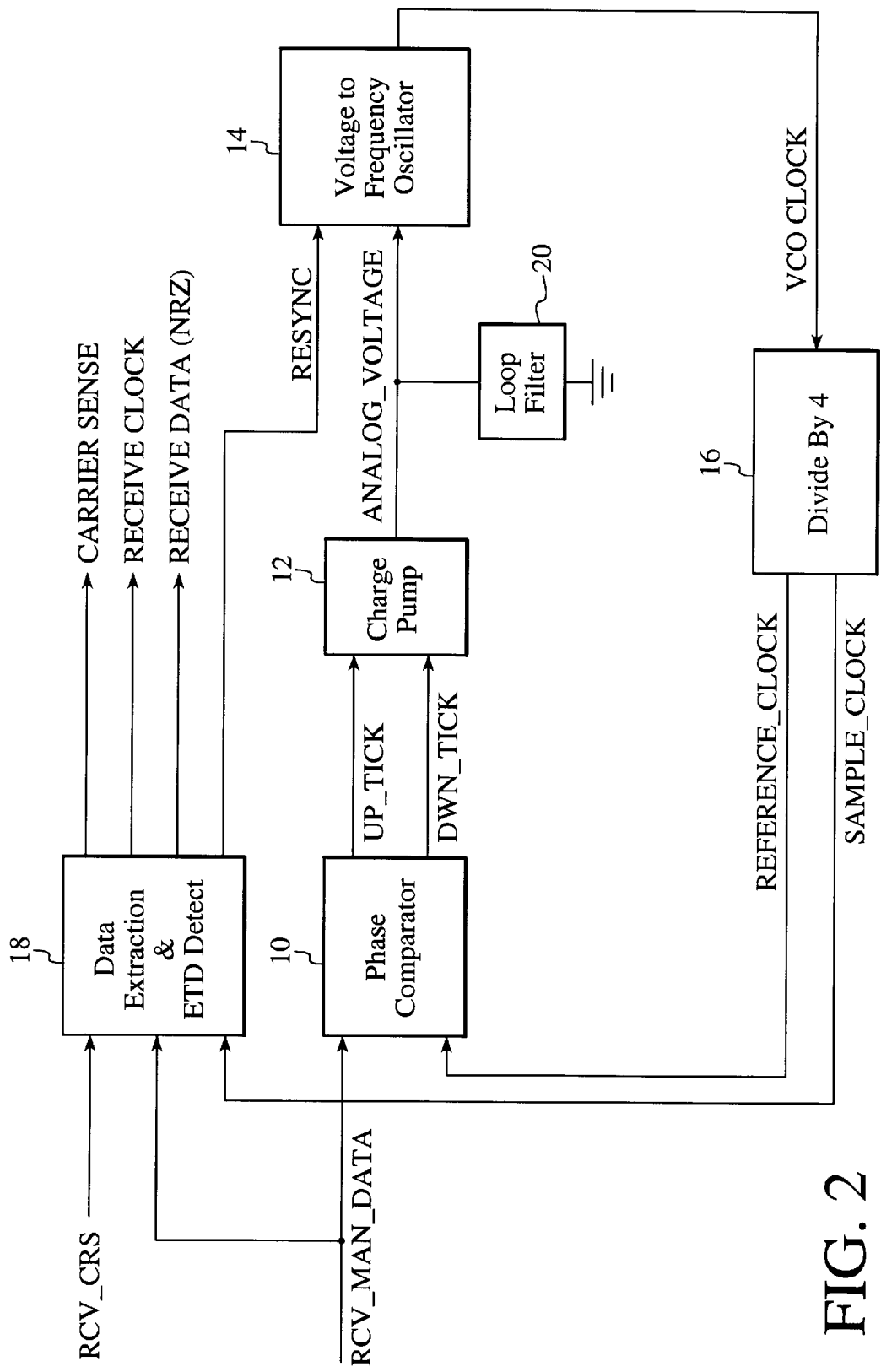
FIG. 2 illustrates a block diagram of a traditional analog Phase Lock Loop (PLL).
Figure 3:
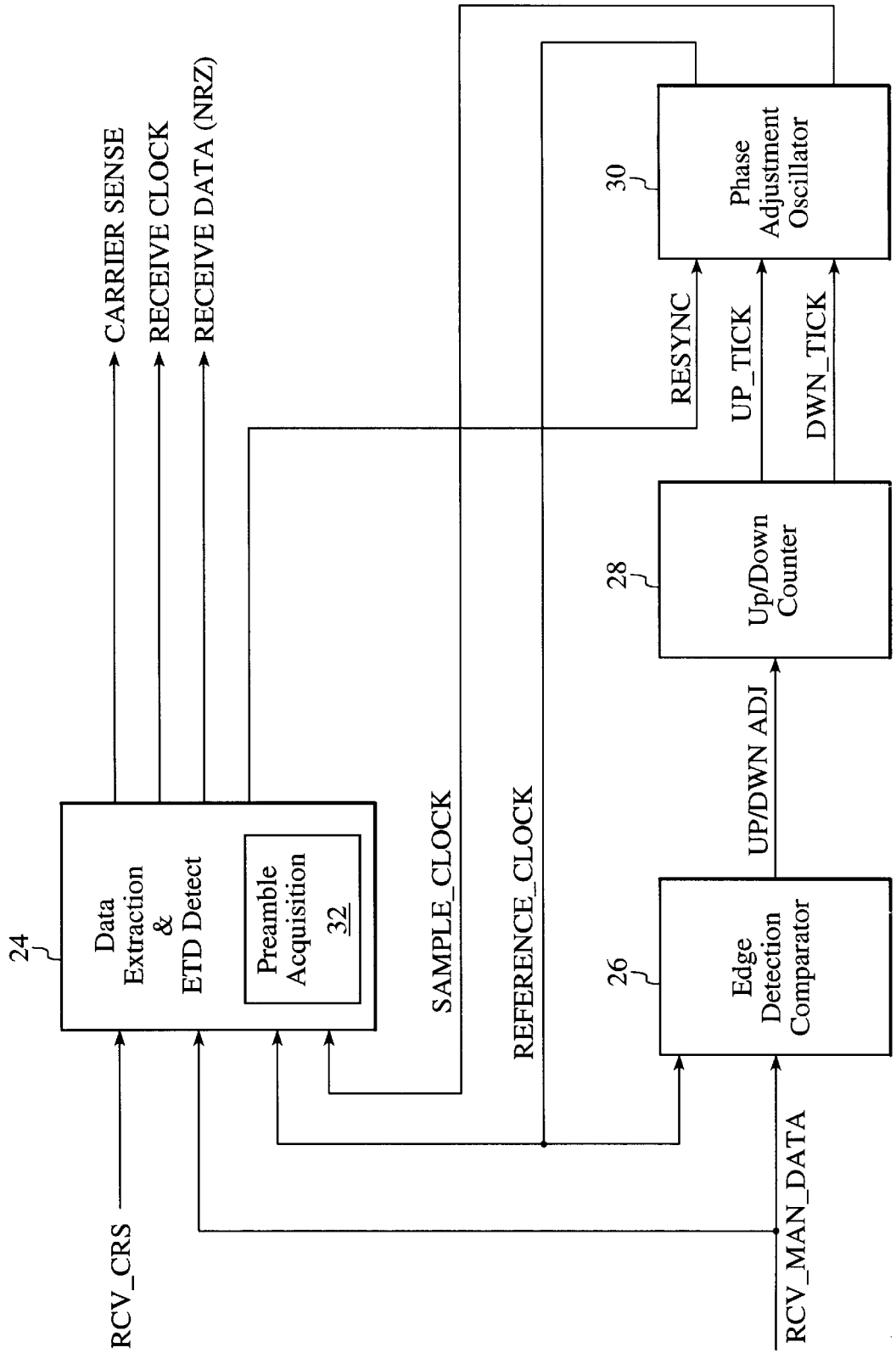
FIG. 3 illustrates a block diagram of a digital PLL in accordance with the present invention.

FIG. 3 illustrates a block diagram of a digital PLL in accordance with the present invention. Included in the digital PLL are a data extraction and ETD circuit 24, an edge detection comparator 26, an up/down counter 28, and a phase adjustment oscillator 30. In general terms, the phase adjustment oscillator 30 replaces the functionality of the VCO 14 and divide by four circuit 16 of the analog PLL (FIG. 2). The up/down counter 28 replaces the functionality of the analog charge pump 12 and loop filter 20. The edge detection comparator 26 replaces the functionality of the phase comparator 10 with a smaller circuit. The data extraction and ETD circuit 24 is based on the data extraction and ETD circuit 18 of the analog PLL. However, the data extraction and ETD circuit 24 includes a preamble acquisition circuit 32 for improving data extraction, the details and operation of which are described with reference to FIG. 4.

The preamble acquisition circuit 32 suitably operates to sample Manchester data at the bit cell boundary to allow for more jitter tolerance during the preamble phase of the Ethernet packet. During the preamble of an Ethernet packet, traditionally a pattern of '1010' occurs. Of course for Manchester data, in which a '1' is signified by a transition from a low logic level to a high logic level at the center of a bit cell and a '0' is signified by a transition from a high logic level to low logic level a '1010' pattern is guaranteed not to have transitions at the bit cell boundary. Sampling at the bit cell boundary suitably provides an increased jitter tolerance of approximately 25 ns from the bit cell center, since during the preamble, the PLL has not accumulated enough transitions to average the jitter in the bit cell center. Thus, the preamble acquisition circuit 32 successfully detects the preamble portion of an Ethernet packet in Manchester data format by sampling at the bit cell boundary of the incoming data.

Figure 1:
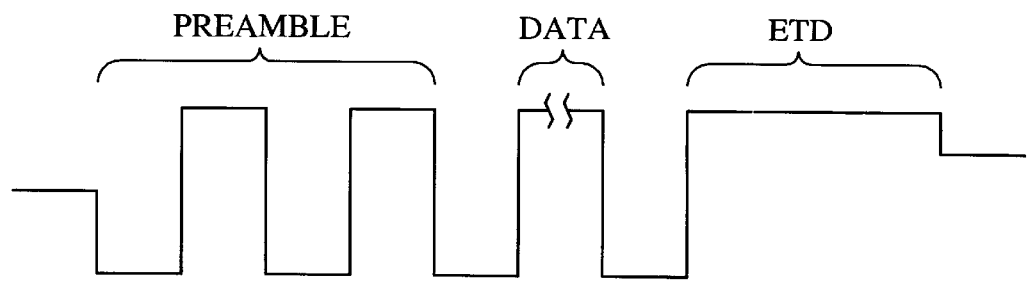
FIG. 1 illustrates a representation of a typical Ethernet data packet.
Figure 4:
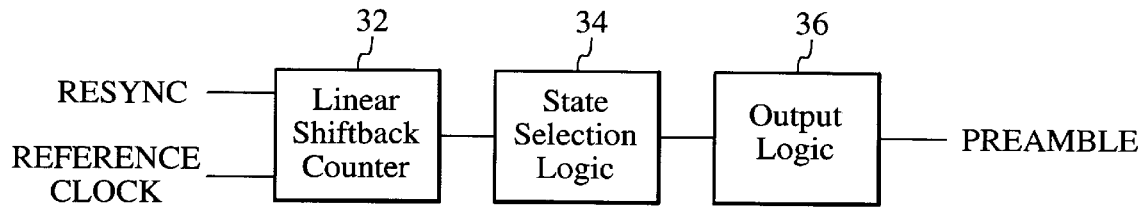
FIG. 4 illustrates a diagram of a preamble acquisition circuit in accordance with the present invention.

Referring to FIG. 4, an overall circuit diagram for the preamble acquisition circuit 32 is shown. The preamble acquisition circuit 32 includes a linear shift-back counter 32 coupled to state selection logic 34 which is coupled to output logic 36. In a preferred operation, the linear shift-back counter 32, e.g., a four bit linear shift feedback counter, receives a start signal such as a resync signal to initiate counting when the carrier sense signal goes to a high logic level to indicate the reception of incoming data. The counter 32 then counts the number of transitions being received. The count value of the counter 32 is received by the state selection logic 34 to determine when a particular count value has been reached.

By way of example, a count value of twelve representing twelve bit times has been found by the inventors to work well as an indicator that the preamble portion of the packet has been successfully received. Further, twelve bit times provides a suitable number of accumulated edges to average the jitter in the bit cell center, so that subsequent data sampling at the quarter-cell point is appropriately achieved, as is well appreciated by those skilled in the art. Thus, the state selection logic 34 suitably detects a count value of twelve, and the output logic 36 then changes state, e.g., a flip-flop transitions from a high logic level to a low logic level, to transition the preamble signal output, which indicates the preamble portion of the packet has been received and the preamble acquisition period has been completed.

To achieve sampling at the bit cell boundary, a multiplexor (not shown) is suitably used to choose an inverted negative edge of the Reference clock signal until the preamble acquisition period is signalled completed. The Reference clock is preferably produced as a 10 MHz signal with a period of 100 ns and adjusted via the phase adjustment oscillator 30 using a 100 MHz stable, on-chip oscillator (not shown), as is described in more detail with reference to FIG. 5. After receipt of the preamble, data sampling thus proceeds at the quarter cell point via use of the Sample clock signal.

Once the preamble acquisition circuit 32 has signalled the completion of the preamble acquisition, the digital PLL proceeds with the clock recovery function for the rest of the data packet. As mentioned above with reference to FIG. 3, the edge detection comparator 26 replaces the analog phase comparator 10 (FIG. 2) function with less complicated circuitry. The edge detection comparator 26 in accordance with the present invention operates as a synchronizer to synchronize the data using the Reference clock signal. Preferably, the synchronizer uses the negative edge of the Reference clock to sample the data.

In a preferred embodiment, the edge detection comparator 26 includes two flip-flops and an XOR gate (not shown) for comparing the frequency of incoming data and the sampling frequency of the Reference clock and producing the up/down adjust signal. The up/down adjust signal of the edge detection comparator 26 suitably determines the direction of adjustment for the up/down counter 28.

The up/down counter 28 receives the up/down adjust signal from the edge detection comparator 26 and suitably operates in accordance with conventional up/down counters, the details of which are well known to those skilled in the art. Preferably, the up/down counter 28 includes a three-bit register counter with a sign bit register. Of course, the number of bits required by the up/down counter 28 varies according to the response characteristics required of the digital PLL circuit. However, increases in the length of the counter can slow the response characteristics while aiding in jitter rejection.

As an example of up/down counter 28 utilization in accordance with the present invention, if the up/down adjust signal for edge detector comparator 26 is asserted, the up/down counter 28 is incremented. Conversely, if the up/down adjust signal is deasserted, the up/down counter 28 is decremented. Once the up/down counter 28 has exhausted its count, e.g., accumulated eight counts in a single direction, 0 to 8 or 0 to –8, and rolls over, an Up tick signal or Down tick signal is appropriately produced and input to the phase adjustment oscillator 30. In a preferred embodiment, the up/down counter 28 further includes a mask element of two flip-flops (not shown) before outputting the Up or Down tick signal to compensate for initialization delays through the counter 28, as is well appreciated by those skilled in the art.

Once the phase adjustment oscillator circuit 30 receives an Up tick or Down tick signal an appropriate adjustment to the phase of the clock signals is performed. Suitably, an Up tick signal indicates that the phase of the Reference clock lags the data, and a Down tick signal indicates that the phase of the Reference clock leads the data. A circuit representation of the phase adjustment oscillator 30 to achieve the appropriate phase adjustment is presented with reference to FIG. 5.

Figure 5:
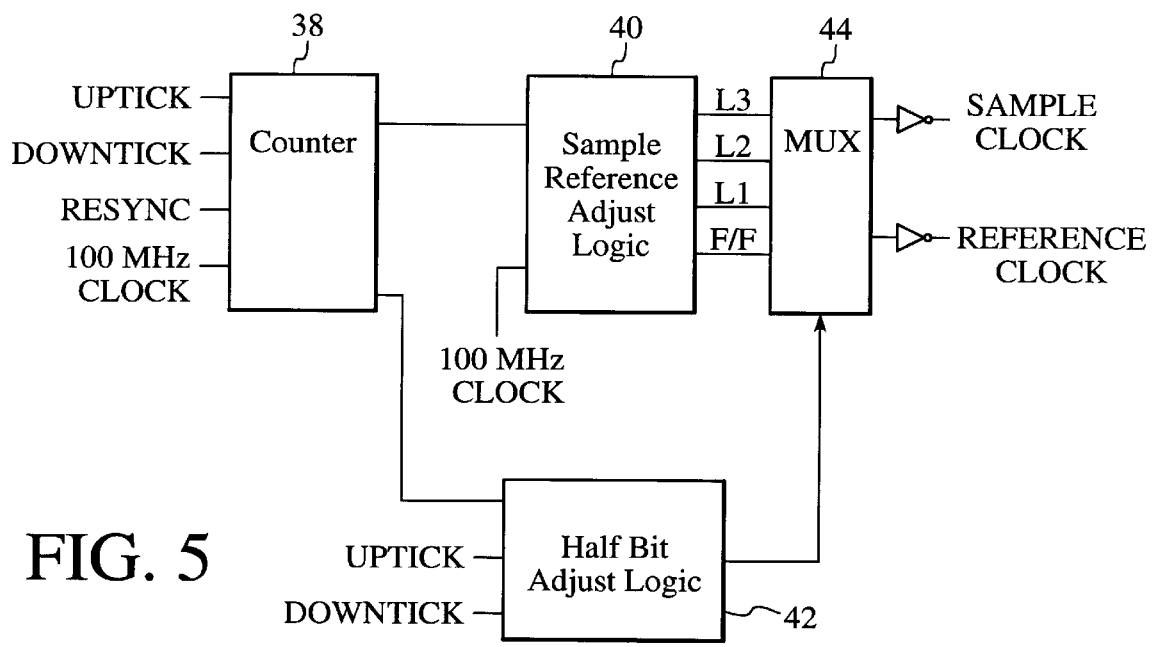
FIG. 5 illustrates a diagram of a phase adjustment oscillator circuit in accordance with the present invention.

Referring to FIG. 5, the phase adjustment oscillator 30 includes a counter 38, sample reference adjust logic 40, half bit adjust logic 42, and multiplexor logic 44. As is described in more detail in the following, phase adjustment oscillator 30 produces 5 ns phase adjustments for the Reference and Sample clock signals. Thus, the phase adjustment oscillator 30 extends the period of the Reference clock by 5 ns to 105 ns or reduces the period of the Reference clock by 5 ns to 95 ns. Of course, the Sample clock, which is offset from the Reference clock by 25 ns, i.e., one-quarter of the Reference clock period, suitably follows the shifts in the Reference clock phase.

In a preferred operation, a clock signal for the phase adjustment oscillator circuit 30 is preferably provided from a 100 MHz clock generated on-chip as a fairly symmetric clock giving 10 ns resolution to the phase adjustment oscillator 30. Thus, the duty cycle of the 100 MHz clock can be suitably trusted to be 5 ns from a positive edge to a negative edge, and vice versa, so that the phase adjustment oscillator 30 capably uses as many of the clock edges as possible to allow a finer resolution phase adjustment for the digital PLL. Of course, other higher frequency on-chip oscillators may be used as desired to provide finer resolution phase adjustments in the digital PLL, as is well understood by those skilled in the art.

Counter 38 is preferably a base counter of standard logic and by way of example, comprises a four-bit counter. The counter 38 preferably divides down the 100 MHz clock by predetermined value using a predetermined count cycle, e.g., dividing by ten by counting in a cycle from 0 to 9 to 0. When a higher frequency oscillator is used, corresponding adjustments to the count and size of the counter 38 are necessary to appropriately divide down the higher frequency, as is well appreciated by those skilled in the art. Alternatively, as is further well-known to those skilled in the art, an on-chip programmable oscillator and clock may be used in accordance with the present invention to produce the desired frequency and division function.

In a preferred operation, when an assertion of the Down tick signal is first received by the counter 38, the counter 38 continues counting in a normal cycle, and the half bit adjust logic 42 transitions to a set state. When a second Down tick signal is received, the half bit adjust logic 42 is cleared, and the counter 38 is suitably short-cycled to count in a cycle from 0 to 8 to 0 before returning to its normal count cycle. With the short-cycling of the counter 38 by one clock period, i.e, 10 ns, the counter 38 makes a phase reduction adjustment of 10 ns.

Conversely, when an assertion of the Up tick signal is received by the counter 38, and the half bit adjust logic 42 is in a clear state, the counter 38 extends its cycle to count in a cycle from 0 to 10 to 0 before returning to its normal count cycle, and the half bit adjust logic 42 transitions to a set state. When a second Up tick signal is received, the half bit adjust logic 42 transitions to a clear state, and the counter 38 retains its normal count cycle. With the extended cycling of the counter 38 by one clock period, the counter 38 makes a phase increase adjustment of 10 ns.

Thus, the Up and Down tick signals generate 10 ns phase adjustments in the counter 38, but shifts of 10 ns are usually considered too large for maintaining good resolution in the Reference and Sample clock signals. The half bit adjust logic 42 allows finer resolution to 5 ns increments by retaining the state of the half bit increments, which is used in conjunction with the multiplexor 44, as described below.

In a preferred embodiment, the sample reference adjust logic 40 samples the output of counter 38 to produce a 10 MHz pulse. The assertion of the Reference clock and Sample clock occurs during a range of count values from the counter 38. The sample reference adjust logic 40 suitably includes a flip-flop (FIF) and three latches (L1, L2, L3) (not shown) to produce a total offset of 25 ns between the Sample clock signal and the Reference clock signal, since a flip-flop typically provides a 10 ns delay and each latch typically provides a 5 ns delay, as is well known to those skilled in the art.

The multiplexor logic 44 preferably receives the outputs from the elements of the sample reference adjust logic 40 and the state of the half bit adjust logic 42, and selects the appropriate signal as the Reference clock and Sample clock. When the count value has been forced to short cycle or extend cycle, the phase has been decreased or increased by 10 ns. The 10 ns phase adjustments by the count values are considered too large, however, to maintain good resolution in the Reference and Sample clock signals. With the 5 ns skews capably provided from the sample reference adjust logic 40 and the half bit adjust states accumulated by the half bit adjust logic 42, the multiplexor 44 preferably selects an appropriate adjusted signal for output as the Reference and Sample clocks.

By way of example, if an action to delay occurs, i.e. when a first Down tick signal is received, the value of counter 38 does not change since it takes two ticks through half bit adjust logic 42 to effect the counter 38. Thus, the action to delay it is effectively accumulated by the half bit adjust logic 42 and selected via the multiplexor logic 44 to provide a delay of 5 ns in the clock signals. When the next action to delay is received, the counter 38 will short cycle causing a full 10 ns change. However, the output of the sample reference adjust logic 40 is appropriately selected via the multiplexor logic 44 to adjust back the 10 ns phase adjustment to a 5 ns phase adjustment for the clock signals.

With the present invention, a digital PLL accurately performs clock recovery functions for Ethernet data in Manchester format transmitted in a communications network. The digital PLL further improves detection of a preamble portion of the data transmitted and provides edge detection capabilities that require less area than analog phase comparators. Additionally, the present inventions achieves sufficient resolutions in phase adjustments through digital components, including a counter and phase adjustment oscillator, to track shifts in the frequency of the data over time. With the digital components of the present invention, digital clock recovery successfully occurs, while power consumption, circuit size, and noise sensitivity are less than that of an analog PLL.

Although the present invention has been described in accordance with the embodiments shown, one of ordinary skill in the art will recognize that there could be variations to the embodiment and those variations would be within the spirit and scope of the present invention. For example, the digital PLL described herein is suitably applicable in various technologies, including Bi-Polar, Bi-CMOS, and GaAs fabrication technologies. In addition, although the preamble acquisition circuit is implemented utilizing a linear shift back counter, one of ordinary skill in the art would readily recognize that this feature could be implemented in a variety of ways, and those implementations would be within the spirit and scope of the present invention. Accordingly, many modifications may be made by one of ordinary skill without departing from the spirit and scope of the present invention, the scope of which is defined by the following claims.

What is claimed is:

1. A digital phase lock loop (PLL) in a data communications network for data and clock recovery of Ethernet data, the digital PLL reducing noise sensitivity and power consumption, the digital PLL comprising:

a data extraction and end of transmission delimiter (ETD) circuit, the data extraction and ETD circuit further comprising a preamble acquisition circuit for detecting the acquisition of a preamble portion of the Ethernet data, wherein the preamble acquisition circuit samples from a bit cell boundary of the Ethernet data to provide increased jitter tolerance at a bit cell center of the Ethernet data;

an edge detection comparator coupled to the data extraction and ETD circuit;

an up/down counter coupled to the edge detection comparator; and a phase adjustment oscillator coupled to the counter and to the data extraction and ETD circuit for producing phase adjustments in a reference clock signal in accordance with shifts in the frequency of the data.

2. A digital phase lock loop (PLL) in a data communications network for data and clock recovery of Ethernet data, the digital PLL reducing noise sensitivity and power consumption, the digital PLL comprising:

a data extraction and end of transmission delimiter (ETD) circuit including a preamble acquisition circuit for detecting the acquisition of a preamble portion of the Ethernet data, wherein the preamble acquisition circuit further comprises a linear shift back counter, a state selection logic coupled to the linear shift back counter, and an output logic coupled to the state selection logic;

an edge detection comparator coupled to the data extraction and ETD circuit;

an up/down counter coupled to the edge detection comparator; and a phase adjustment oscillator coupled to the counter and to the data extraction and ETD circuit for producing phase adjustments in a reference clock signal in accordance with shifts in the frequency of the data.

3. The digital phase lock loop of claim 1 wherein the phase adjustment oscillator adjusts the reference clock signal and a sample clock signal by a phase adjustment within Ethernet specifications.

4. The digital phase lock loop of claim 3 wherein the phase adjustment comprises a 5 nanosecond (ns) phase adjustment.

5. A digital phase lock loop (PLL) in a data communications network for data and clock recovery of Ethernet data, the digital PLL reducing noise sensitivity and power consumption, the digital PLL comprising:

a data extraction and end of transmission delimiter (ETD) circuit;

an edge detection comparator coupled to the data extraction and ETD circuit;

an up/down counter coupled to the edge detection comparator; and a phase adjustment oscillator coupled to the counter and to the data extraction and ETD circuit for producing phase adjustments in a reference clock signal in accordance with shifts in the frequency of the data, wherein the phase adjustment oscillator further comprises a counter, a sample reference adjust logic coupled to the counter, a half bit adjust logic coupled to the counter, and a multiplexor logic coupled to the half bit adjust logic and the sample reference adjust logic.

6. The digital phase lock loop of claim 5 wherein the counter comprises a four bit counter counting in a predetermined count cycle.

7. The digital phase lock loop of claim 6 wherein the counter receives up and down adjust signals from the up/down counter.

8. The digital phase lock loop of claim 7 wherein the up and down adjust signals alter the predetermined count cycle of the counter.

9. The digital phase lock loop of claim 5 wherein the multiplexor logic outputs the reference clock signal.

10. The system of claim 11 wherein the digital PLL circuit further determines an end of acquisition of a preamble portion of the data with a preamble acquisition circuit of the data extraction and ETD circuit.

11. A system for data and clock recovery of Ethernet data of Manchester format in a network the system comprising: a digital phase lock loop (PLL) circuit, the digital PLL circuit for a) receiving the data in a data extraction and ETD circuit of the digital PLL circuit and an edge detection comparator of the digital PLL circuit; b) adjusting a phase of a reference clock and a sample clock to track transitions in the data; (c) determining whether the reference clock and data are synchronous in the edge detection comparator; (d) outputting an up/down adjust signal from the edge detection comparator when the data and reference clock are not synchronous; (e) adjusting an up/down counter from the up/down adjust signal; and (f) outputting an up tick or a down tick signal from the up/down counter when a predetermined count value in a predetermined count direction has been reached.

12. The system of claim 11 wherein outputting the up tick occurs when the predetermined count value is eight and the predetermined count direction is positive.

13. The system of claim 11 wherein outputting the down tick occurs when the predetermined count value is minus eight and the predetermined count direction is negative.

14. The system of claim 11 wherein the digital PLL circuit further receives the up tick and down tick signals in a phase adjustment oscillator, wherein the phase adjustment oscillator alters the phase adjustment time period of the reference clock and sample clock by a predetermined phase.

15. The system of claim 14 wherein the predetermined phase adjustment time period is one-half the period of a high frequency input clock to the phase adjustment oscillator.

16. The system of claim 15 wherein the high frequency input clock is a 100 MHz clock.

17. The system of claim 16 wherein the predetermined phase adjustment time period is 5 ns.

18. The method of claim 14, the method further including the step of determining an end of acquisition of a preamble portion of the data with a preamble acquisition circuit of the data extraction and ETD circuit.

19. A method for data and clock recovery of Ethernet data of Manchester format in a network, the method comprising the steps of:
   a) receiving the data in a data extraction and ETD circuit of a digital PLL circuit and an edge detection comparator of the digital PLL circuit;
   b) adjusting a phase of a reference clock and a sample clock to track transitions in the data through the digital PLL;
   c) determining whether the reference clock and data are synchronous in the edge detection comparator;
   d) outputting an up/down adjust signal from the edge detection comparator when the data and reference clock are not synchronous;
   e) adjusting an up/down counter from the up/down adjust signal; and
   f) outputting an up tick or a down tick signal from the up/down counter when a predetermined count value in a predetermined count direction has been reached.

20. The method of claim 19 wherein outputting the up tick occurs when the predetermined count value is eight and the predetermined count direction is positive.

21. The method of claim 19 wherein outputting the down tick occurs when the predetermined count value is minus eight and the predetermined count direction is negative.

22. The method of claim 19, the method further including the step of g) receiving the up tick and down tick signals in a phase adjustment oscillator, wherein the phase adjustment oscillator alters the phase adjustment time period of the reference clock and sample clock by a predetermined phase.

23. The method of claim 22 wherein the predetermined phase adjustment time period is one half the period of a high frequency input clock to the phase adjustment oscillator.

24. The method of claim 23 wherein the high frequency input clock is a 100 MHz clock.

25. The method of claim 24 wherein the predetermined phase adjustment time period is 5 ns.

* * * * *